United States Patent
Kang et al.

(10) Patent No.: US 6,879,510 B2
(45) Date of Patent: Apr. 12, 2005

(54) NONVOLATILE FERROELECTRIC MEMORY DEVICE AND METHOD FOR OPERATING THE SAME

(75) Inventors: Hee Bok Kang, Taejon-kwangyokshi (KR); Hun Woo Kye, Kyonggi-do (KR); Duck Ju Kim, Cheju-do (KR); Je Hoon Park, Kyonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 137 days.

(21) Appl. No.: 10/286,913

(22) Filed: Nov. 4, 2002

(65) Prior Publication Data

US 2003/0086286 A1 May 8, 2003

(30) Foreign Application Priority Data

Nov. 5, 2001 (KR) ...................... P2001-68650

(51) Int. Cl.[7] .............................. G11C 11/22; G11C 5/06
(52) U.S. Cl. ...................... 365/145; 365/65; 365/230.03
(58) Field of Search ............................. 365/145, 230.03, 365/185.11, 65

(56) References Cited

U.S. PATENT DOCUMENTS 6,091,624 A * 7/2000 Kang ........................ 365/145
6,198,681 B1 * 3/2001 Forbes ....................... 365/205
6,297,985 B1 * 10/2001 Kang ......................... 365/145
6,297,986 B1 * 10/2001 Jae Kap ..................... 365/145

* cited by examiner

*Primary Examiner*—Anh Phung
*Assistant Examiner*—J. H. Hur
(74) *Attorney, Agent, or Firm*—Mayer, Brown, Rowe & Maw LLP

(57) ABSTRACT

A nonvolatile ferroelectric memory device includes a top cell array block having a first plurality of unit cells, each with a pair of first and second top split wordlines, a bottom cell array block provided with a second plurality of unit cells, each having a pair of first and second bottom split wordlines to correspond to the pair of first and second top split wordlines, a top split wordline driver controlling an output signal transmitted to the first and second top split wordlines of the top cell array block, a bottom split wordline driver controlling an output signal transmitted to the first and second bottom split wordlines of the bottom cell array block, a split wordline driver controller outputting first and second split wordline control signals, and a sensing amplifier arranged for each bitline between the top cell array block and the bottom cell array block.

20 Claims, 11 Drawing Sheets

P : electric charge
V : electric field

NONVOLATILE FERROELECTRIC MEMORY DEVICE AND METHOD FOR OPERATING THE SAME

The present invention claims the benefit of the Korean Application No. P2001-68650 filed in Korea on Nov. 5, 2001, which is hereby incorporated by reference.

BACKGROUND OF THE INVENTION

1. Field of the Invention

The present invention relates to a semiconductor memory, and more particularly, to a nonvolatile ferroelectric memory device and a method for operating the same.

2. Discussion of the Related Art

In general, a nonvolatile ferroelectric memory such as a ferroelectric random access memory (FRAM), for example, has a data processing speed equivalent to that of a dynamic random access memory (DRAM), and the nonvolatile ferroelectric memory retains data during a power OFF state. Accordingly, nonvolatile ferroelectric memories are commonly considered to be one of a next generation of memory devices.

The FRAM and DRAM are memory devices with similar structures, but the FRAM includes a ferroelectric capacitor having high residual polarization characteristics. The residual polarization characteristics permit retention of data when an applied electric field is removed.

FIG. 1 illustrates a hysteresis loop of a general ferroelectric material according to the related art. In FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A cell array of a related art nonvolatile ferroelectric memory device and a method for operating the same will now be described with reference to the accompanying drawings. FIG. 2A is a schematic view showing a unit cell of a split wordline SWL according to the related art, FIG. 2B is a circuit diagram illustrating a nonvolatile ferroelectric memory device according to the related art, and FIG. 3 is a timing chart illustrating operation of the nonvolatile ferroelectric memory device according to FIG. 2B.

In FIG. 2A, a unit cell of the nonvolatile ferroelectric memory device has a 1T/1C structure. The unit cell includes first and second split wordlines SWL1 and SWL2 formed with a prescribed interval in a row direction, and first and second bitlines B/L1 and B/L2 formed across and preferably substantially perpendicular to the first and second split wordlines SWL1 and SWL2. A first transistor T1 has a gate coupled with the first split wordline SWL1 and a drain coupled with the first bitline B/L1. A first ferroelectric capacitor FC1 is coupled between a source of the first transistor T1 and the second split wordline SWL2. A second transistor T2 has a gate coupled with the second split wordline SWL2 and drain coupled with the second bitline B2, and a second ferroelectric capacitor FC2 is coupled between a source of the second transistor T2 and the first split wordline SWL1. A plurality of the unit cells constitute a cell array. In view of a data storage unit, a pair of split wordlines and a bitline, a transistor T1, and a ferroelectric capacitor FC1 constitute a unit cell. In view of a data structure, a pair of split wordlines, two bitlines, two transistors, and two ferroelectric capacitors constitute a unit cell.

In FIG. 2B, a plurality of split wordline pairs including first and second split wordlines SWL1 and SWL2 in pairs are preferably formed in row direction. A plurality of bitlines B/L1 and B/L2 are formed across the split wordline pairs. Sensing amplifiers SA are formed between the respective bitlines to sense data transmitted through the bitlines and transfer the sensed data to a data line DL or a data bar line /DL.

At this time, a sensing amplifier enable portion and a selection switching portion CS are provided (not shown). The sensing amplifier enable portion outputs a sensing amplifier enable signal SEN to enable the sensing amplifiers SA, and the selection switching portion CS selectively switches bitlines and data lines.

In FIG. 3, a period t0 denotes a period before the first split wordline SWL1 and the second split wordline SWL2 are activated to "high(H)". During the period t0, all of the bitlines are preferably precharged to a threshold voltage level of an NMOS transistor.

A period t1 denotes a period in which the first and second split wordlines SWL1 and SWL2 are enabled to become "H". During the period t1, data of the ferroelectric capacitor in the main cell are transmitted to the main bitline such that the bitline level is varied.

When the ferroelectric capacitor has a logic value "high", since electric fields having opposite polarities are applied to the bitline and the split wordline, the polarity of the ferroelectric is destroyed so that a large amount of current flows. Thus, a high voltage is induced in the bitline.

By contrast, when the ferroelectric capacitor has a logic value "low", since electric fields having the same polarities are applied to the bitline and the split wordline, polarity of the ferroelectric is not destroyed so that a small amount of current flows. Thus, a low voltage is induced in the bitline.

During a period t2, if the cell data is loaded in the bitline sufficiently, the sensing amplifier enable signal SEN is transited to high so as to activate the sensing amplifier. As a result, the bitline level is amplified.

Since the logic data "H" of the destroyed cell cannot be restored at the state that the first and second split wordlines SWL1 and SWL2 are high, the data can be restored during a period t3.

Subsequently, during the period t3, the column selection signal CS is activated at "high" level and the bitline of the cell is connected with the data bus line.

During the read mode, the bitline data is transmitted to the data bus. During the write mode, the data bus is transmitted to the bitline.

During the period t3, the first split wordline SWL1 is transited to low, the second split wordline SWL2 is maintained at high level, and the second transistor T2 is turned ON.

At this time, if the corresponding bitline is high, high data is transmitted to one electrode of the second ferroelectric capacitor FC2 so that logic value "1" is restored between the low level of the first split wordline SWL1 and the high level of the bitline.

During a period t4, data of the first bitline BL1 or the second bitline BL2 has a logic value of "0". The logic value of "0" is written in each ferroelectric capacitor by maintaining the first split wordline at high level.

Meanwhile, when the first bitline BL1 and the second bitline BL2 are high, no changes occur in data of the cell.

During a period t5, the first split wordline SWL1 is maintained at high level and the second split wordline SWL2 is transited to low, and the first transistor T1 is turned ON.

At this time, if the corresponding bitline BL1 is high, high data is transmitted to one electrode of the first ferroelectric capacitor FC1 so that the logic value "1" is restored between the low level of the second split wordline SWL2 and the high level of the first bitline BL1.

A period t6 denotes a precharge period for preparing the next cycle operation.

The aforementioned related art ferroelectric memory device and the method for operating the same have several problems.

Since the wordline driver and the plate line driver are separately operated, the wordline driver has a small delay due to its small size, but the plate line driver causes serious driver RC delay due to its great size.

SUMMARY OF THE INVENTION

Accordingly, the present invention is directed to a nonvolatile ferroelectric memory device and a method for operating the same that substantially obviates one or more problems due to limitations and disadvantages of the related art.

An object of the present invention is to provide a nonvolatile ferroelectric memory device and a method for operating the same that improves operational speed and sensing margin.

Additional features and advantages of the invention will be set forth in part in the description which follows, and in part will be apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a nonvolatile ferroelectric memory device includes a top cell array block including a first plurality of unit cells, each unit cell having a pair of first and second top split wordlines connected with a gate of a switching transistor and one node of a ferroelectric capacitor, and each unit cell formed in a split structure with a corresponding unit cell along a bitline, a bottom cell array block provided with a second plurality of unit cells, each unit cell having a pair of first and second bottom split wordlines to correspond to the pair of first and second top split wordlines, the first and second bottom split wordlines being connected with a gate of a switching transistor and one node of a ferroelectric capacitor, a top split wordline driver controlling an output signal transmitted to the pair of first and second top split wordlines of the top cell array block, a bottom split wordline driver controlling an output signal transmitted to the pair of first and second bottom split wordlines of the bottom cell array block, a split wordline driver controller outputting first and second split wordline control signals transmitted to the first and second top split wordlines and the first and second bottom split wordlines, under control of the top and bottom split wordline drivers, and a sensing amplifier arranged for each bitline between the top cell array block and the bottom cell array block.

In another aspect, a nonvolatile ferroelectric memory device includes a top cell array block including a first plurality of unit cells, each unit cell having a pair of first and second top split wordlines connected with a gate of a switching transistor and one node of a ferroelectric capacitor, and each unit cell formed in a split structure with a corresponding unit cell along a bitline, a bottom cell array block provided with a second plurality of unit cells, each unit cell having a pair of first and second bottom split wordlines to correspond to the pair of first and second top split wordlines, the first and second bottom split wordlines being connected with a gate of a switching transistor and one node of a ferroelectric capacitor, a top split wordline driver controlling an output signal transmitted to the pair of first and second top split wordlines of the top cell array block, a bottom split wordline driver controlling an output signal transmitted to the pair of first and second bottom split wordlines of the bottom cell array block, a split wordline driver controller outputting first and second split wordline control signals transmitted to the first and second top split wordlines and the first and second bottom split wordlines, under control of the top and bottom split wordline drivers, and a sensing amplifier arranged for each bitline between the top cell array block and the bottom cell array block.

In another aspect, a nonvolatile ferroelectric memory device includes a first top cell array block provided with a first plurality of unit cells, each unit cell having a pair of first and second top split wordlines connected with a gate of a switching transistor and one node of a ferroelectric capacitor, a second top cell array block provided with a second plurality of unit cells having one of a same structure and a symmetrical structure as the first top cell array block, a first bottom cell array block having a split structure with the first top cell array block along a bitline, a second bottom cell array block having a split structure with the second top cell array block along the bitline, a top split wordline driver controlling an output signal transmitted to the pair of first and second top split wordlines of the first and second top cell array blocks, a bottom split wordline driver controlling an output signal transmitted to the pair of first and second bottom split wordlines of the first and second bottom cell array blocks, a split wordline driver controller outputting first and second split wordline control signals transmitted to the pair of first and second top split wordlines and the pair of first and second bottom split wordlines, under control of the top and bottom split wordline drivers, and a sensing amplifier arranged for each bitline between the first top cell array block and the first bottom cell array block and between the second top cell array block and the second bottom cell array block.

In another aspect, a method for operating a nonvolatile ferroelectric memory device that includes a top cell array block and a bottom cell array block arranged in a split structure along a bitline, a pair of first and second top split wordlines and a pair of first and second bottom split wordlines respectively arranged in the top cell array block and the bottom cell array block, a top split wordline driver and a bottom split wordline driver respectively arranged in the top cell array block and the bottom cell array block, and a split wordline driver controller generating a first split wordline control signal transmitted to the first top split wordline and the first bottom split wordline, and a second split wordline control signal transmitted to the second top split wordline and the second bottom split wordline, including the steps of outputting in the top split wordline driver first and second top switching control signals activated at a high level during one cycle, and at a same time outputting in the bottom split wordline driver first and second bottom switching control signals of a low level, activating the first and second top split wordlines at a high level when the first and second split wordline control signals are output at a high level, respectively transmitting a low level and a high level to the first and second top split wordlines when the first and second split wordline control signals are respectively output at a low level and a high level, and respectively transmitting a high level and a low level to the first and second top split wordlines when the first and second split wordline control signals are output at a high level and a low level.

In another aspect, a method for operating a nonvolatile ferroelectric memory device that includes a top cell array block and a bottom cell array block arranged in a split structure along a bitline, a pair of first and second top split wordlines and a pair of first and second bottom split wordlines respectively arranged in the top cell array block and the bottom cell array block, a top split wordline driver and a bottom split wordline driver respectively arranged in the top cell array block and the bottom cell array block, and a split wordline driver controller generating a first split wordline control signal transmitted to the first top split wordline and the first bottom split wordline, and a second split wordline control signal transmitted to the second top split wordline and the second bottom split wordline, includes the steps of outputting in the top split wordline driver first and second top switching control signals of a low level during one cycle, and at a same time outputting in the bottom split wordline driver first and second bottom switching control signals of a high level, activating the first and second top split wordlines at high level when the first and second split wordline control signals are output at a high level, respectively transmitting a low level and a high level to the first and second bottom split wordlines when the first and second split wordline control signals are respectively output at a low level and a high level, and respectively transmitting a high level and a low level to the first and second bottom split wordlines when the first and second split wordline control signals are output at a high level and a low level.

In another aspect, a method for operating a nonvolatile ferroelectric memory device that includes a top cell array block and a bottom cell array block arranged in a split structure along a bitline, a pair of first and second top split wordlines and a pair of first and second bottom split wordlines respectively arranged in the top cell array block and the bottom cell array block, a top split wordline driver and a bottom split wordline driver respectively arranged in the top cell array block and the bottom cell array block, and a split wordline driver controller generating a first split wordline control signal transmitted to the first top split wordline and the first bottom split wordline, and a second split wordline control signal transmitted to the second top split wordline and the second bottom split wordline, includes the steps of outputting in the top and bottom split wordline drivers first and second top switching control signals and first and second bottom switching control signals at a high level during one cycle, activating the first and second top split wordlines and the first and second bottom split wordlines at a high level when the first and second split wordline control signals are output at a high level, respectively transmitting a low level and a high level to the first and second top split wordlines when the first and second split wordline control signals are respectively output at a low level and a high level, and at a same time respectively transmitting a low level and a high level to the first and second bottom split wordlines, and respectively transmitting a high level and a low level to the first and second top split wordlines when the first and second split wordline control signals are respectively output at a high level and a low level, and at a same time respectively transmitting a high level and a low level to the first and second bottom split wordlines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
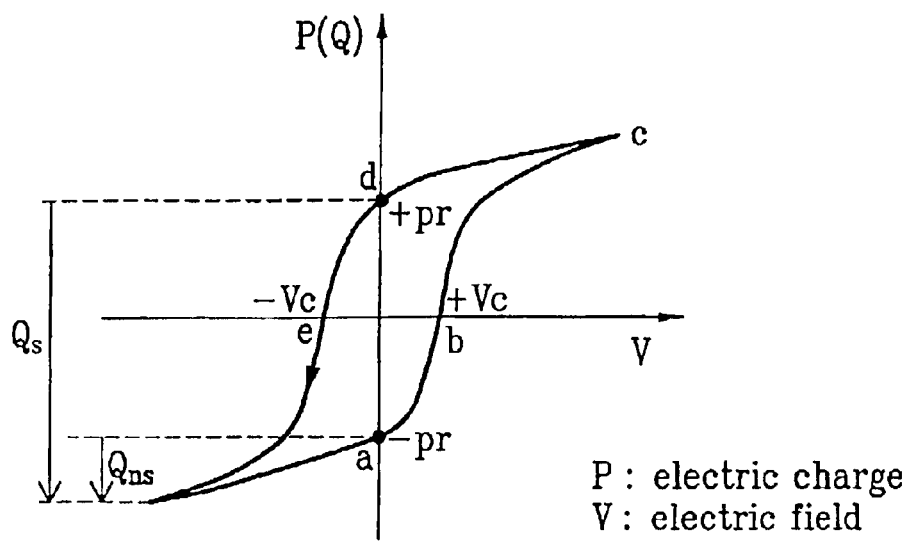
FIG. 1 illustrates a hysteresis loop of a general nonvolatile ferroelectric memory device according to the related art.
Figure 2A:
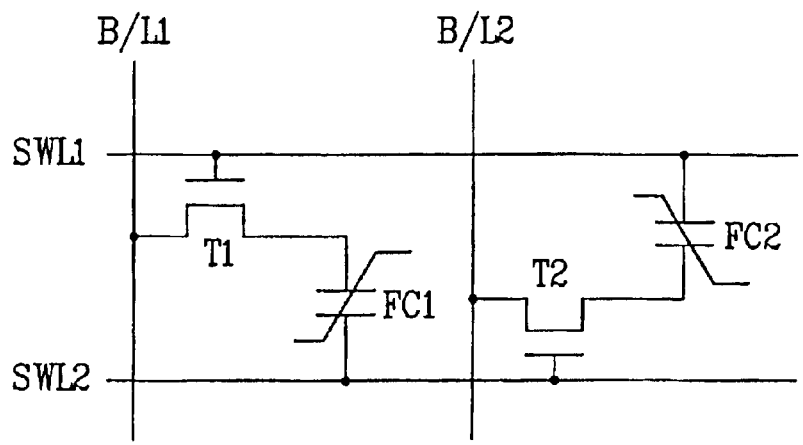
FIG. 2A is a schematic view of a unit cell of a split wordline SWL according to the related art.
Figure 2B:
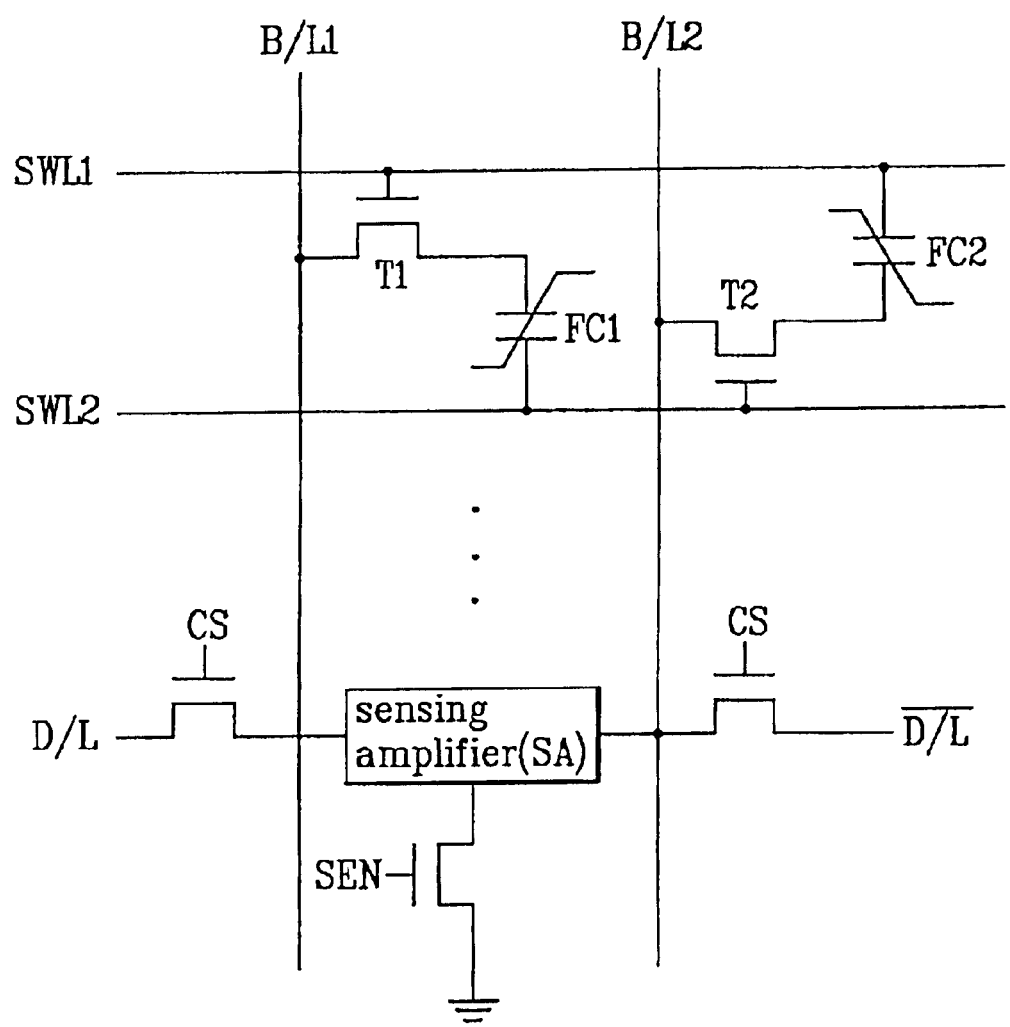
FIG. 2B is a schematic view illustrating a circuit for driving the unit cell of FIG. 2A according to the related art.
Figure 3:
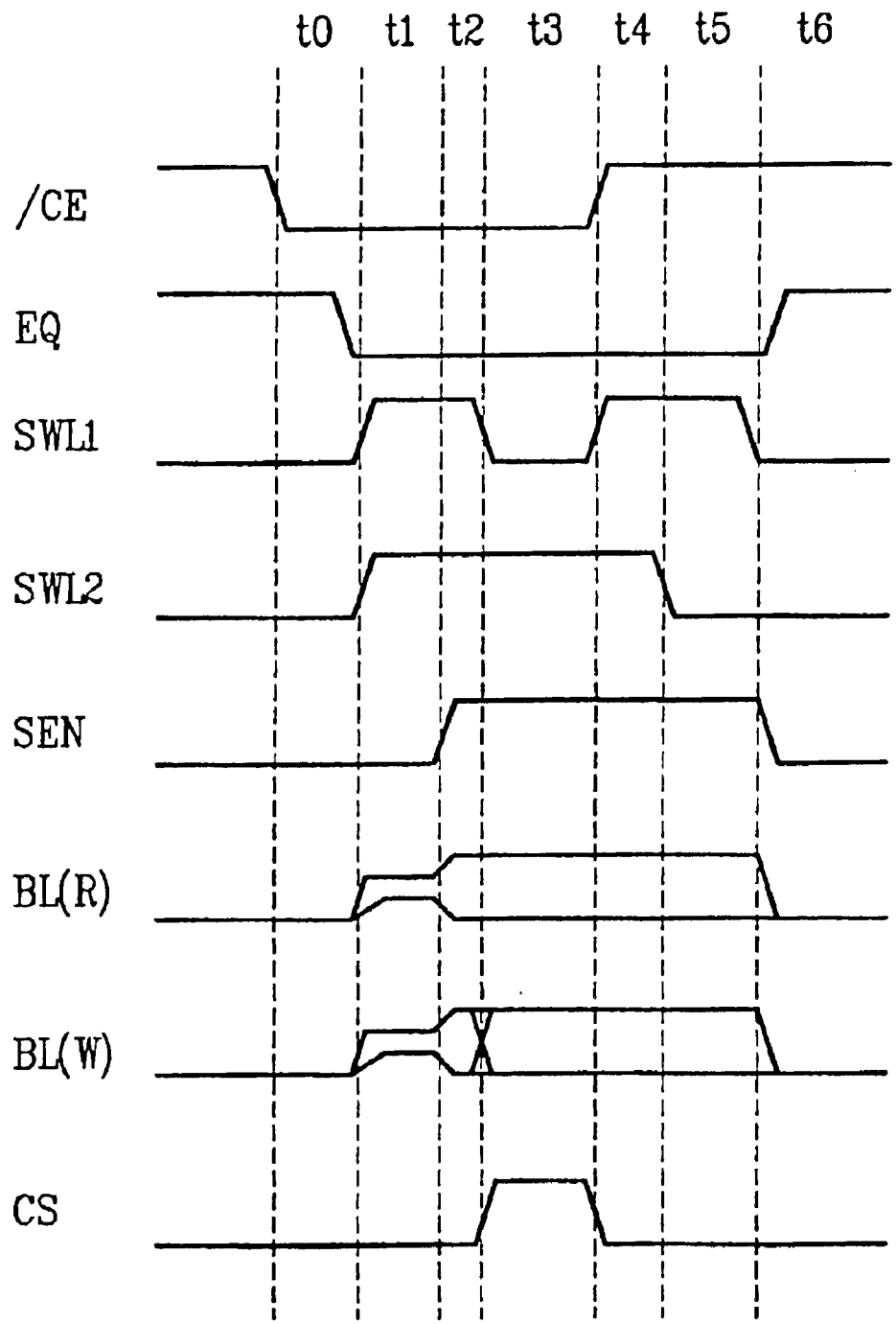
FIG. 3 is a timing chart illustrating the operation of the circuit of FIG. 2B according to the related art.

Reference will now be made in detail to the preferred embodiments of the present invention, examples of which are illustrated in the accompanying drawings. Wherever possible, the same reference numbers will be used throughout the drawings to refer to similar parts.

In the present invention, a cell array may be arranged so that 1T1C/2T2C operation may be implemented in an open bitline method. A top cell array block and a bottom cell array block may be arranged around a sensing amplifier. The top cell array block may include first and second top cell arrays at both sides (left and right sides) around a top split wordline driver. The bottom cell array block may include first and second bottom cell arrays at both sides (left and right sides) around a bottom split wordline driver.

Each cell of the top cell array block and the bottom cell array block may be controlled by first and second top split wordlines and first and second bottom split wordlines. Opposing cells in the top and bottom cell array blocks may be controlled as follows.

It is assumed that a first top split wordline signal of the top cell array block controls a gate of an NMOS transistor of a cell, and a second top split wordline signal is connected to one electrode of a ferroelectric capacitor to control driving of the ferroelectric capacitor. In this case, a second bottom split wordline signal of the bottom cell array block controls the gate of the NMOS transistor, while a first bottom split wordline signal is connected to one electrode of the ferroelectric capacitor to control driving of the ferroelectric capacitor. Accordingly, by separately controlling the top and bottom cell array blocks, it is possible to reduce driver RC delay of first and second split wordline control signals in the top and bottom split wordline drivers.

In other words, in the related art, since the wordline driver and the plate line driver are separately operated, the wordline driver has a small driver delay due to its small size, but the plate line driver causes serious driver RC delay due to its great size.

At this time, a significant time delay occurs between a wordline/plate line driving signal of the top block and a wordline/plate line driving signal of the bottom block. Also, since the plate line driver requires a greater size than that of the wordline driver, RC delay factor of the plate line driving signal becomes greater than that of the wordline driving signal. To reduce RC load difference, it is necessary to make the wordline RC load equal to the plate line RC load. To minimize time delay in the drivers of the top and bottom blocks, a split wordline cell driving method is employed in the present invention.

Unlike the related art split wordline cell driving method in which a cell array is arranged by a horizontal driving method in a wordline direction, in the present invention, a cell array may be arranged by a vertical driving method in a bitline direction. Also, the top split wordline driver and the bottom split wordline driver may be provided, and a load is dispersed in first and second top split wordlines and first and second bottom split wordlines in the top and bottom blocks so as not to generate load difference.

Figure 4:
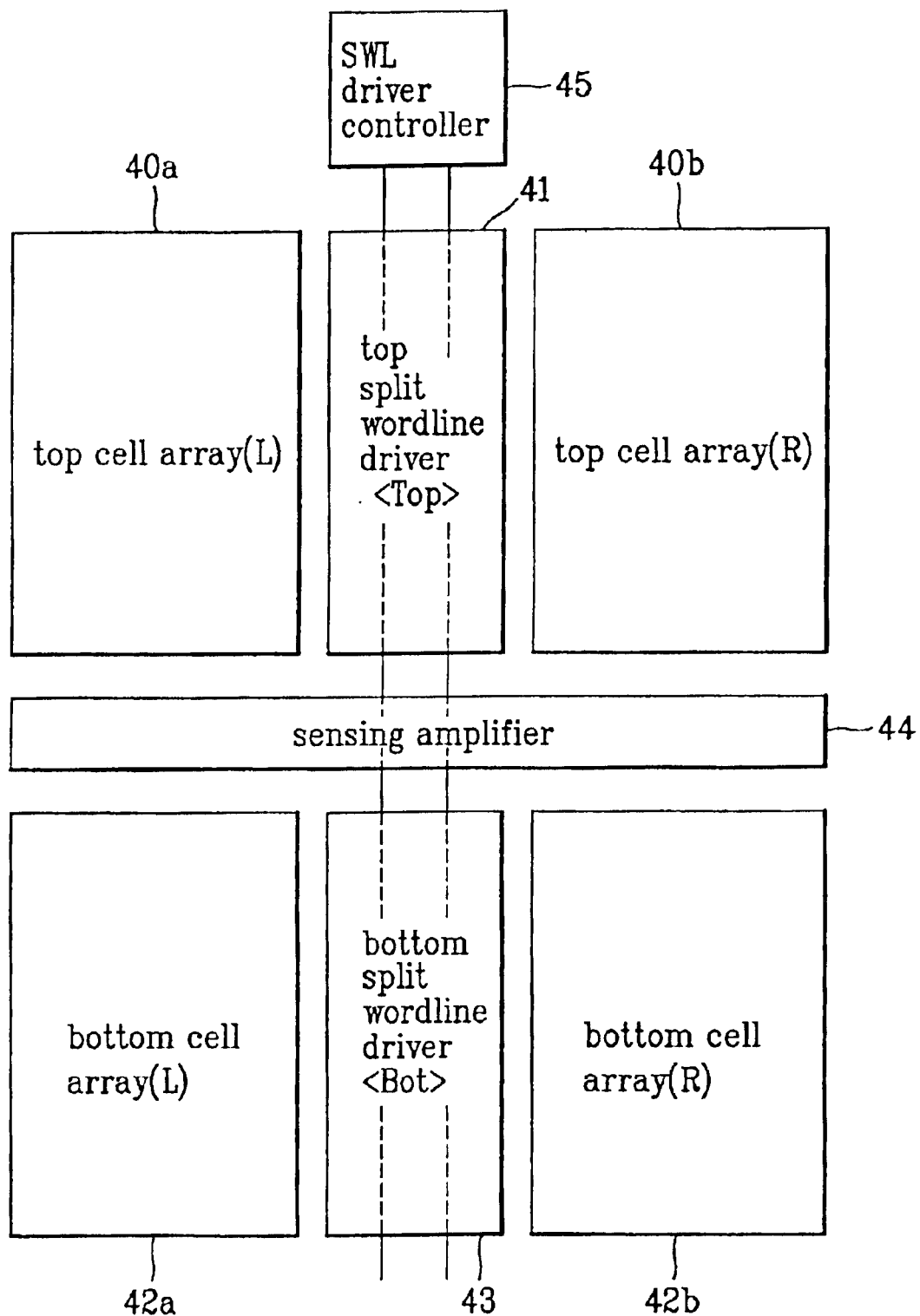
FIG. 4 is a block diagram illustrating an exemplary nonvolatile ferroelectric memory device according to the present invention.

FIG. 4 is a block diagram illustrating an exemplary nonvolatile ferroelectric memory device according to the present invention. In FIG. 4, a nonvolatile ferroelectric memory device may include a top cell array block, a bottom cell array block, and a sensing amplifier 44 that may be formed between the top and bottom cell array blocks.

The top cell array block may include a first top cell array L 40a and a second top cell array R 40b at both sides (left and right sides) around a top split wordline driver 41. The bottom cell array block may include a first bottom cell array L 42a and a second bottom cell array R 42b at both sides (left and right sides) around a bottom split wordline driver 43. A split wordline driver controller 45 may be provided to control driving of the top split wordline driver 41 and the bottom split wordline driver 43.

Figure 5:
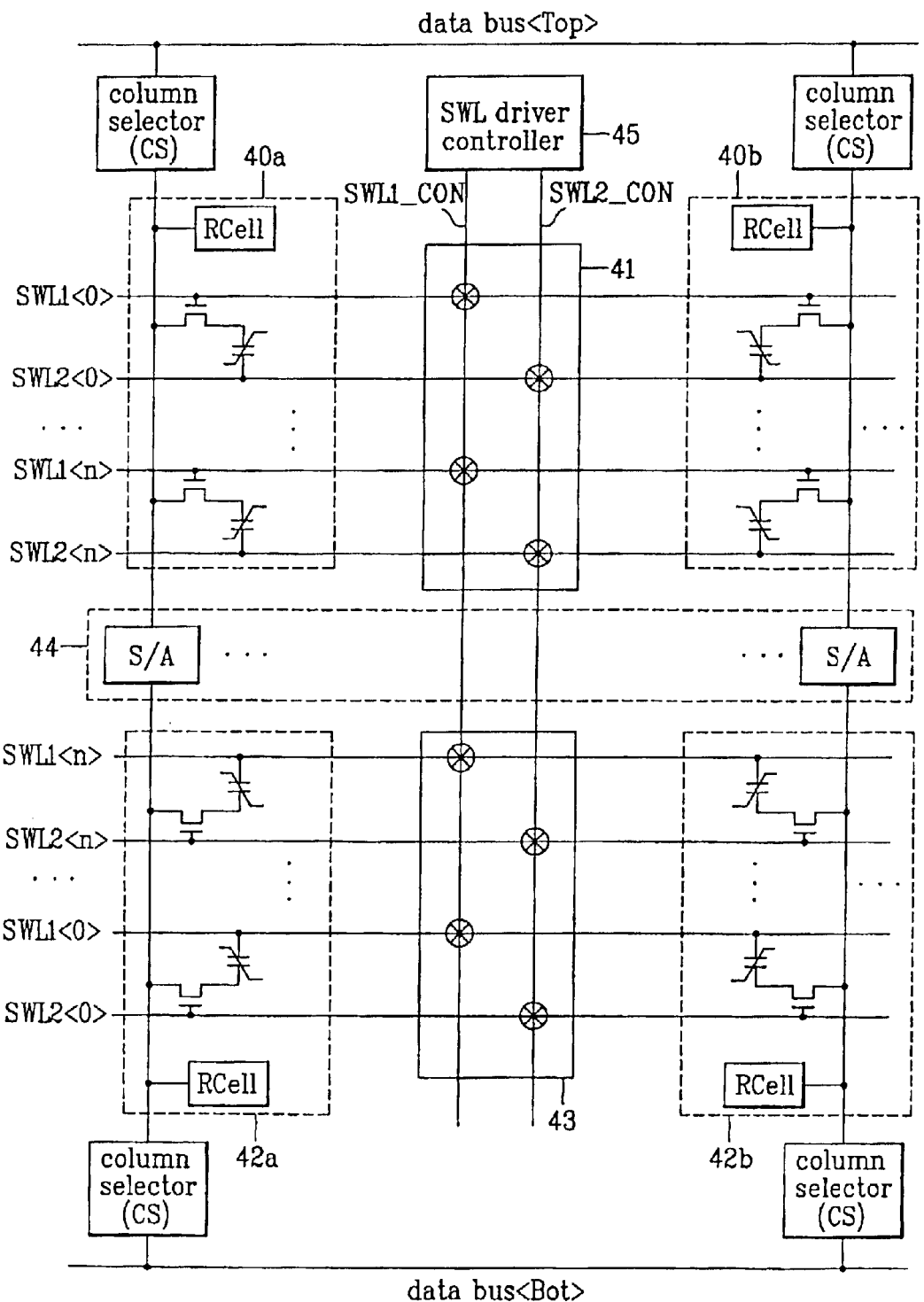
FIG. 5 is a circuit diagram of an exemplary cell array according to the present invention.
Figure 6:
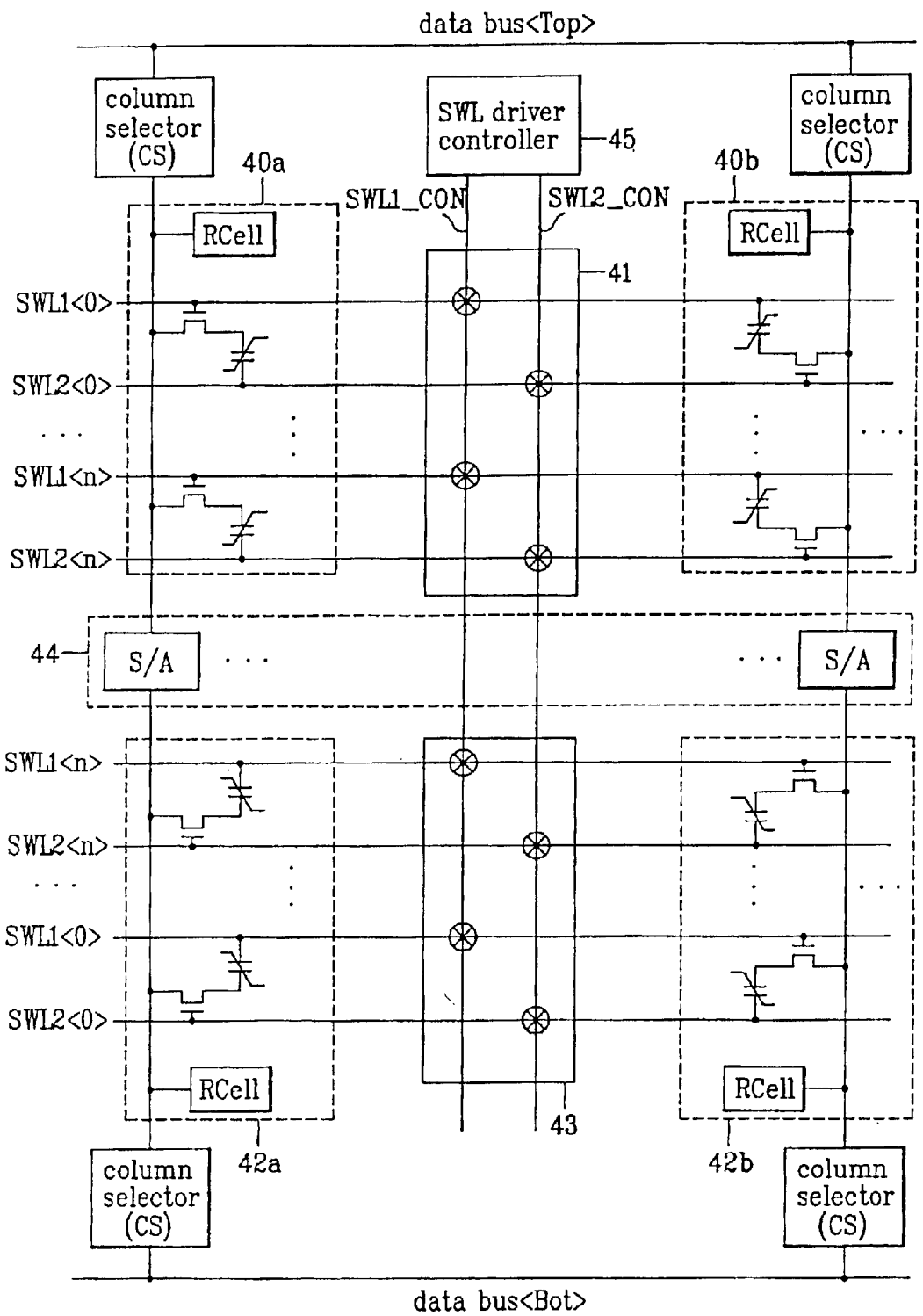
FIG. 6 is a circuit diagram of another exemplary cell array according to the present invention.

FIGS. 5 and 6 are circuit diagrams of an exemplary cell array according to the present invention. In FIGS. 5 and 6, a cell array may include a top block and a bottom block, and a sensing amplifier 44 arranged per bitline between the top cell array block and the bottom cell array block. In the top cell array block, a first top cell array 40a may be disposed at a left side of a top split wordline driver 41, and a second top cell array 40b may be disposed at a right side of the top split wordline driver 41.

The top and bottom split wordline drivers 41 and 43 serve to transmit first and second wordline control signals SWL1_CON and SWL2_CON output from the split wordline driver controller 45 to the first and second top split wordlines and to the first and second bottom split wordlines.

The first and second top cell arrays 40a and 40b may include a plurality of split wordlines arranged in parallel pairs, and a plurality of bitlines arranged to be perpendicular to the split wordlines.

A column selector CS may be respectively connected to respective ends of the bitlines of the first and second top cell arrays 40a and 40b and to the first and second bottom cell arrays 42a and 42b. The column selector CS may be connected with a data bus, and a reference cell RCell may be arranged to be adjacent to the column selector CS.

A unit cell in the first and second top cell arrays 40a and 40b may include a pair of split wordlines, a switching transistor, and a ferroelectric capacitor. The switching transistor and the ferroelectric capacitor may be arranged per bitline, thereby the unit cell may have a matrix arrangement. Accordingly, a unit cell in the first and second bottom cell arrays 42a and 42b may include a pair of split wordlines arranged in parallel, and a plurality of bitlines arranged to be perpendicular to the split wordlines. In addition, an NMOS transistor and a ferroelectric capacitor may be arranged per two split wordlines and a bitline, thereby performing a switching operation.

The split wordlines in the top cell array may be arranged to be symmetrical to the split wordlines of the bottom cell array. The first and second split wordline control signals SWL1_CON and SWL2_CON of the split wordline (SWL) driver controller 45 may be transmitted to the first and second top split wordlines and the first and second bottom split wordlines. Accordingly, the first top split wordlines SWL1<0> to SWL1<n> among the split wordlines in pairs in the top cell array and the bottom cell array may be operated under the control of the first split wordline control signal SWL1_CON, while the second top split wordlines SWL2<0> to SWL2<n> may be operated under the control of the second split wordline control signal SWL2_CON.

In FIG. 5, gates of NMOS transistors may be connected with the first top split wordline SWL1<0> of the first and second top cell arrays 40a and 40b, and first nodes of the ferroelectric capacitors may be connected with the second top split wordline SWL2<0>. Likewise, first nodes of ferroelectric capacitors may be connected with a first bottom split wordline SWL1<0> of the first and second bottom cell arrays 42a and 42b, and gates of NMOS transistors may be connected with the second bottom split wordline SWL2<0>.

The first top split wordlines and the first bottom split wordlines in the top and bottom cell arrays may be operated under the control of a first split wordline control signal, and the second top split wordline and the second bottom split wordline may be operated under the control of a second split wordline control signal. Accordingly, the first top cell array 40a and the second top cell array 40b may have the same cell arrangement, and the first bottom cell array 42a and the second bottom cell array 42b may have the same cell arrangement.

A circuit structure of the top and bottom split wordline drivers 41 and 43 according to the present invention will be described with reference to FIGS. 7 and 8.

Figure 7:
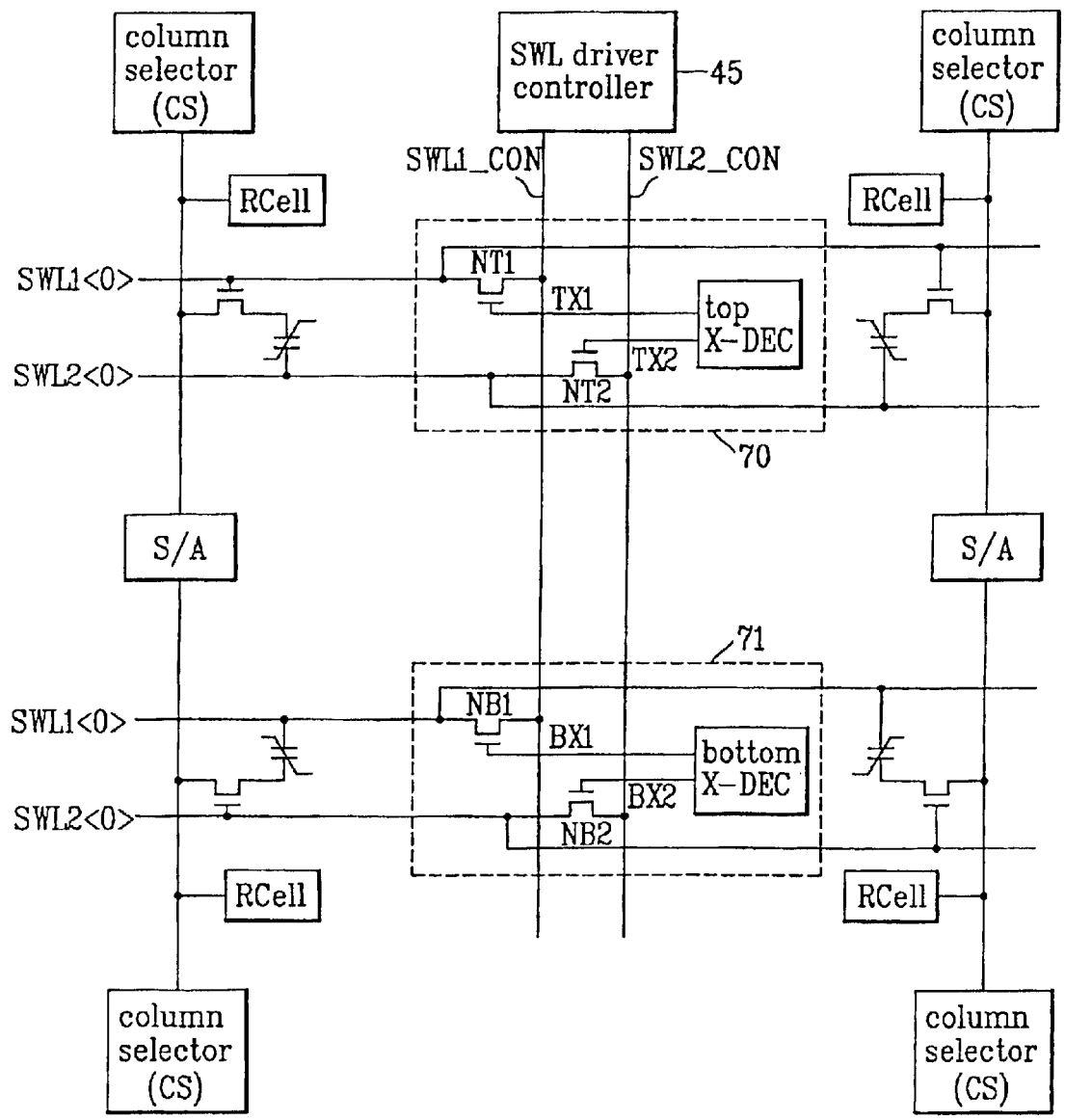
FIG. 7 is an exemplary circuit diagram according to the present invention including a circuit of top and bottom split wordline drivers.

FIG. 7 is an exemplary circuit diagram according to the present invention including a circuit of top and bottom split wordline drivers. In FIG. 7, a unit circuit 70 of the top split wordline driver 41 (of FIG. 5) of a top cell array block according to the present invention may include a first top X-decoder, a first top NMOS transistor NT1, and a second top NMOS transistor NT2. The first top NMOS transistor NT1 and the second top NMOS transistor NT2 may perform a switching operation. The top X-decoder outputs first and second top transmission signals TX1 and TX2 for controlling the switching operation of the first and second NMOS transistors NT1 and NT2.

The first top NMOS transistor NT1 serves to transmit the first split wordline control signal SWL1_CON to the first top split wordline SWL1<0> under control of the first top transmission signal TX1. Moreover, the first top transmission signal TX1 of the top X-decoder may be input to a gate terminal of the first top NMOS transistor NT1, and a first split wordline control signal SWL1_CON of a split wordline (SWL) driver controller 45 may be input to a drain terminal of the first top NMOS transistor NT1. A source terminal of the first top NMOS transistor NT1 may be connected with a gate terminal of a switching transistor of each cell connected with the first top split wordline SWL1<0>.

The second top NMOS transistor NT2 serves to transmit the second split wordline control signal SWL2_CON to the second top split wordline SWL2<0> under the control of the second top transmission signal TX2. Moreover, the second top transmission signal TX2 of the top X-decoder may be input to a gate terminal of the second top NMOS transistor NT2, and the second split wordline control signal SWL2_CON of the split wordline (SWL) driver controller 45 may be input to a drain terminal of the second top NMOS transistor NT2. A source terminal of the second top NMOS transistor NT2 may be connected with one node of a ferroelectric capacitor of each cell connected with the second top split wordline SWL2<0>.

A unit circuit of the bottom split wordline driver 43 of the bottom cell array block according to the present invention will be described.

In FIG. 7, the unit circuit 71 of the bottom split wordline driver 43 (of FIG. 5) of the bottom cell array block may include a first bottom X-decoder, a first bottom NMOS transistor NB1, and a second bottom NMOS transistor NB2. The first and second bottom NMOS transistors NB1 and NB2 may perform a switching operation. The bottom X-decoder outputs first and second bottom transmission signals BX1 and BX2 for controlling the switching operation of the first and second bottom NMOS transistors NB1 and NB2.

The first bottom NMOS transistor NB1 serves to transmit the first split wordline control signal SWL1_CON to the first bottom split wordline SWL1<0> under control of the first bottom transmission signal BX1. Moreover, the first bottom transmission signal BX1 of the bottom X-decoder may be input to a gate terminal of the first bottom NMOS transistor NB1, and a first split wordline control signal SWL1_CON of the split wordline (SWL) driver controller 45 may be input to a drain terminal of the first bottom NMOS transistor NB1. A source terminal of the first bottom NMOS transistor NB1 may be connected with one node of a ferroelectric capacitor of each cell connected with the first bottom split wordline SWL1<0>.

The second bottom NMOS transistor NB2 serves to transmit the second split wordline control signal SWL2_CON to the second top split wordline SWL2<0> under the control of the second bottom transmission signal BX2. Moreover, the second bottom transmission signal BX2 of the bottom X-decoder may be input to a gate terminal of the second bottom NMOS transistor NB2, and the second split wordline control signal SWL2_CON of the split wordline (SWL) driver controller 45 may be input to a drain terminal of the second bottom NMOS transistor NB2. A source terminal of the second bottom NMOS transistor NB2 may be connected with a gate terminal of a switching transistor of each cell connected with the second bottom split wordline SWL2<0>.

As described above, the first and second split wordline control signals SWL1_CON and SWL2_CON may be input to the top and bottom cell arrays. A decision whether to activate the top and bottom cell arrays may be determined by the first and second top transmission signals and the first and second bottom transmission signals output from the top X-decoder and the bottom X-decoder.

In the top cell array block, the first top NMOS transistor NT1 may have a relatively small size so that the first top split wordline signal can drive the NMOS transistor of the cell. In addition, the second top NMOS transistor NT2 of the top cell array block may have a relatively large size so that the second top split wordline signal can drive the ferroelectric capacitor of the cell. In the bottom cell array block, the first bottom NMOS transistor NB1 may have a relatively large size so that the first bottom split wordline signal can drive the ferroelectric capacitor of the cell. In addition, the second bottom NMOS transistor NB2 of the bottom cell array block may have a relatively small size so that the second bottom split wordline signal can drive the NMOS transistor of the cell.

Therefore, respective NMOS transistors constituting the top and bottom split wordline drivers of the top and bottom cell array blocks have the same size. Accordingly, a problem resulting from an RC load difference can be prevented.

A cell array of another exemplary nonvolatile ferroelectric memory device according to the present invention will be described with reference to FIG. 6.

In FIG. 6, an NMOS transistor and a ferroelectric capacitor may include a unit cell of a second top cell array 40b in such a manner that the first top split wordline SWL1<0> may be connected with one electrode of the ferroelectric capacitor and the second top split wordline SWL12<0> may be connected with the gate of the NMOS transistor. Also, an NMOS transistor and a ferroelectric capacitor include a unit cell of a second bottom cell array 42b in such a manner that the first bottom split wordline SWL1<0> may be connected with the gate of the NMOS transistor and the second bottom split wordline SWL2<0> may be connected with one electrode of the ferroelectric capacitor.

As described above, the NMOS transistor and the ferroelectric capacitor that include each cell of the first top cell array 40a and the second top cell array 40b may be operated under control of first and second split wordline control signals, which may be different from each other. The NMOS transistor and the ferroelectric capacitor that include each cell of the first bottom cell array 42a and the second bottom cell array 42b may also be operated under control of the first and second split wordline control signals, which may be different from each other.

A circuit structure of the top and bottom split wordline drivers 80 and 81 according to the present invention will be described.

In FIG. 7, the first top split wordline SWL1<0>, which is an output terminal of the first top NMOS transistor NT1 of the top split wordline driver 70, may be connected to the gate of the NMOS transistor constituting a cell of the second top cell array. Furthermore, the second top split wordline SWL2<0>, which is an output terminal of the second top NMOS transistor NT2 of the top split wordline driver 70, may be connected to one node of the ferroelectric capacitor constituting a cell of the second top cell array.

Figure 8:
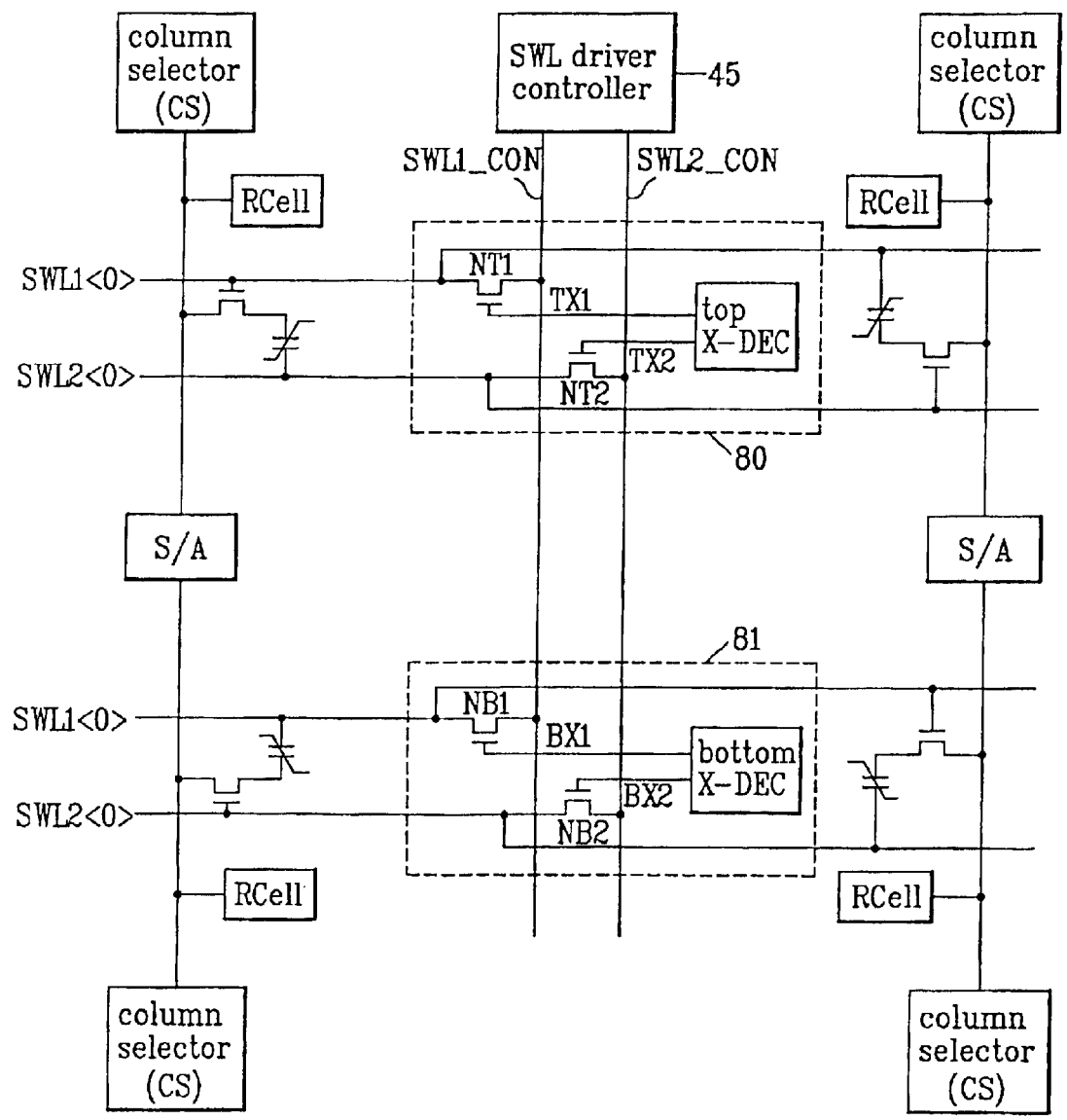
FIG. 8 is another exemplary circuit diagram according to the present invention including a circuit of top and bottom split wordline drivers.

In FIG. 8, the first top split wordline SWL1<0>, which is an output terminal of the first top NMOS transistor NT1 of the top split wordline driver 80, may be connected to one node of the ferroelectric capacitor constituting a cell of the second top cell array. Furthermore, the second top split wordline SWL2<0>, which is an output terminal of the second top NMOS transistor NT2 of the top split wordline driver 80, may be connected to the gate of the NMOS transistor constituting a cell of the second top cell array.

In FIG. 7, the first bottom split wordline SWL1<0>, which is an output terminal of the first bottom NMOS transistor NB1 of the bottom split wordline driver 71, is connected with one node of the ferroelectric capacitor constituting a cell of the second bottom cell array. In contrast, in FIG. 8, the first bottom split wordline SWL1<0>, which is an output terminal of the first bottom NMOS transistor NB1 of the bottom split wordline driver 81, may be connected with the gate of the NMOS transistor constituting a cell of the second bottom cell array.

In FIG. 7, the second bottom split wordline SWL2<0>, which is an output terminal of the second bottom NMOS transistor NB2 of the bottom split wordline driver 71, may be connected with the gate of the NMOS transistor constituting a cell of the second bottom cell array. In contrast, in FIG. 8, the second bottom split wordline SWL2<0>, which is an output terminal of the second bottom NMOS transistor NB2 of the bottom split wordline driver 81, may be connected with one node of the ferroelectric capacitor constituting a cell of the second bottom cell array.

Accordingly, the top cell array, the bottom cell array, and the bottom split wordline driver are arranged, thereby implementing an 2T2C/1T1C operation.

A method for operating the aforementioned nonvolatile ferroelectric memory device according to the present invention will now be described.

The NMOS transistor of each cell of the first top cell array and the second top cell array according to the exemplary device of FIG. 7 may be driven by the first top split wordline signal, while the ferroelectric capacitor of each cell may be driven by the second top split wordline signal.

The NMOS transistor of each cell of the first bottom cell array and the second bottom cell array according to the device of FIG. 7 may be driven by the second bottom split wordline signal, while the ferroelectric capacitor of each cell may be driven by the first bottom split wordline signal.

In other words, the NMOS transistor and the ferroelectric capacitor constituting each cell of the bottom cell array corresponding to the top cell array in the cell array according to the device of FIG. 7 may be driven by different split wordline signals.

The NMOS transistor and the ferroelectric capacitor constituting each cell of the first and second top cell arrays are driven by the same split wordline signal. The NMOS transistor and the ferroelectric capacitor constituting each cell of the first and second bottom cell arrays are driven by the same split wordline signal.

The operation of the nonvolatile ferroelectric memory device according to the present invention will now be described in two cases.

In a first case, corresponding split wordlines of the top cell array block and the bottom cell array block are respectively (alternatively) activated. In a second case, corresponding split wordlines of the top cell array block and the bottom cell array block are simultaneously activated.

In the first case where the split wordlines of the top cell array block and the bottom cell array block are respectively activated, the operation of a 1T1C chip structure is implemented. In the second case where the split wordlines of the top cell array block and the bottom cell array block are simultaneously activated, the operation of a 2T2C chip structure is implemented.

Figure 9:
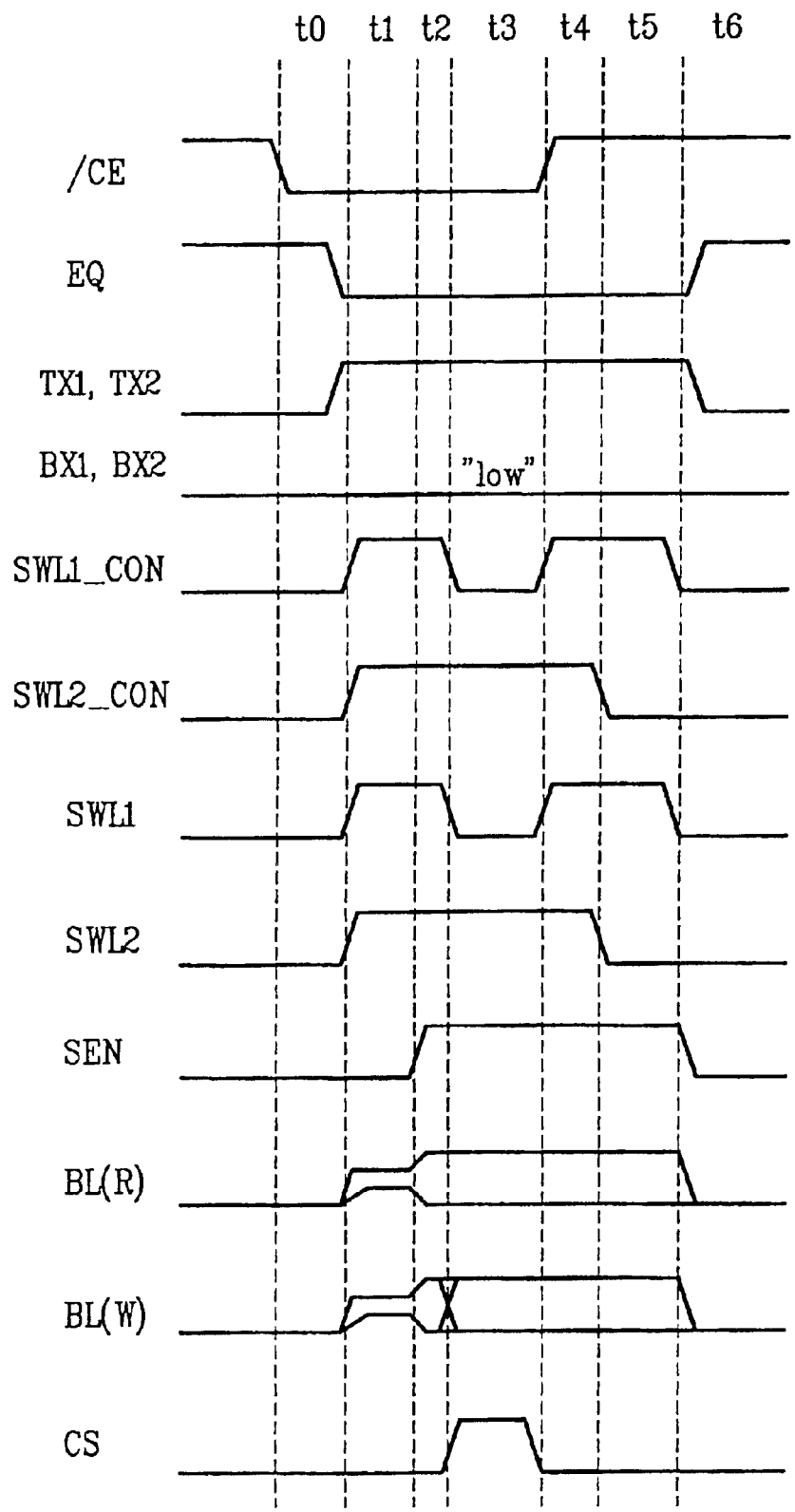
FIG. 9 is an operational timing chart of an exemplary method in the circuit according to the present invention.
Figure 10:
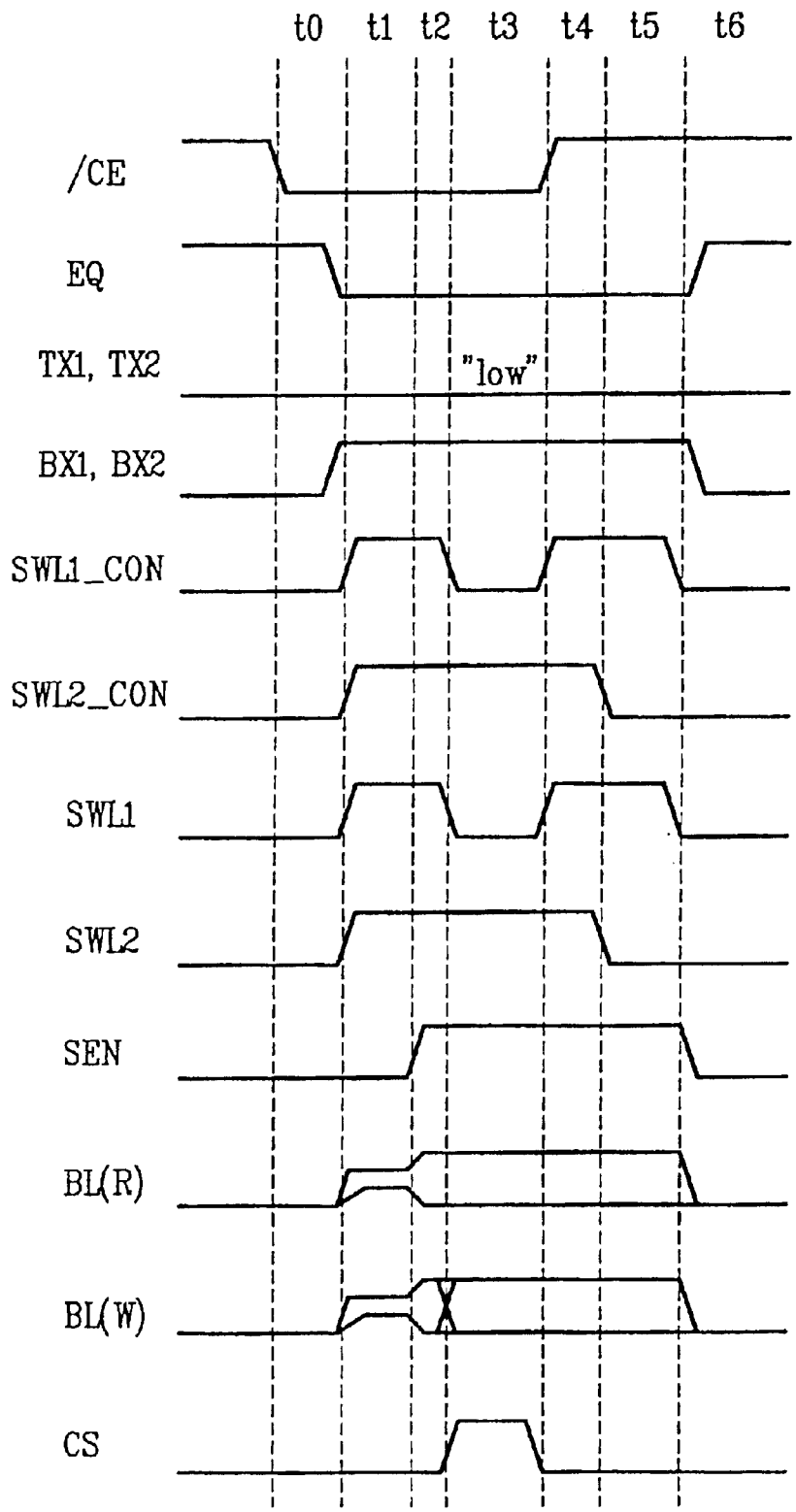
FIG. 10 is an operational timing chart of another exemplary method in the circuit according to the present invention.

First, operation of a 1T1C structure based on the exemplary cell array according to the present invention will be described with reference to FIGS. 9 and 10. FIG. 9 is an exemplary operational timing chart when the top cell array block only is activated, and FIG. 10 is another exemplary operational timing chart when the bottom cell array block only is activated.

When the top cell array block only is activated, the operation of the 1T1C chip will be described.

In FIG. 9, the top cell array block only is activated, in which the first and second top transmission signals TX1 and TX2 are high, and the first and second bottom transmission signals BX1 and BX2 are low. A chip enable bar signal /CE may be output at a low level during periods t0~t3, while an equalizer signal EQ may be output at a low level during periods t1~t5. In the top X-decoder of the top split wordline driver 70 in FIG. 7, the first and second top transmission signals TX1 and TX2 may be output at a high level during the periods t1~t5. In the bottom X-decoder of the bottom split wordline driver 71 in FIG. 7, the first and second bottom transmission signals BX1 and BX2 may be output at a low level during periods t0~t6. Moreover, during one cycle, the top split wordline driver may output the first and second top transmission signals activated at a high level, and at a same time the bottom split wordline driver may output the first and second bottom transmission signals activated at a low level.

The SWL driver controller 45 may output the first split wordline control signal SWL1_CON at a high level during the periods t1 and t2, at a low level during the period t3, and at a high level during the periods t4 and t5. The SWL driver controller 45 may also output the second split wordline control signal SWL2_CON at a high level during the periods t1~t4.

Once the top transmission signals TX1 and TX2 of a high level are input to the first and second top NMOS transistors NT1 and NT2, the first and second top NMOS transistors NT1 and NT2 may be turned ON, so that the first top split wordline SWL1 may output the first split wordline control signal SWL1_CON and the second top split wordline SWL2 may output the second split wordline control signal SWL2_CON. Moreover, the first and second split wordline control signals are output at a high level, and the first and second top split wordlines are activated at a high level. Likewise, the first and second split wordline control signals are respectively output at a low level and a high level, and the first and second top split wordlines are respectively activated at a low level and a high level. Likewise, the first and second split wordline control signals are respectively output at a high level and a low level, and the first and second top split wordlines are respectively activated at a high level and a low level.

The period t0 denotes a period before the first split wordline SWL1 and the second split wordline SWL2 may be activated at a high level. During the period t0, all of the bitlines are preferably precharged at a threshold voltage level of the NMOS transistor.

During the period t1, the top transmission signals TX1 and TX2 may be maintained at a high level, and the bottom transmission signals BX1 and BX2 may be maintained at a low level. The first and second top NMOS transistors NT1 and NT2 may be turned ON as the first and second split wordline control signals SWL1_CON and SWL2_CON are output at a high level. During the period t1, the first and second top split wordlines SWL1 and SWL2 may become a high level, and data of the ferroelectric capacitor in the main cell may be transmitted to the main bitline so that the main bitline level is varied. When the ferroelectric capacitor has a logical "high" value, since electric fields having opposite polarities may be applied to the bitline and the split wordline, the polarity of the ferroelectric is destroyed so that a large amount of current flows. Thus, a high voltage is induced in the bitline. By contrast, when the ferroelectric capacitor has a logical "low" value, since electric fields having the same polarities may be applied to the bitline and the split wordline, polarity of the ferroelectric is not destroyed so that a small amount of current flows. Thus, a low voltage is induced in the bitline.

During the period t2, if the cell data are sufficiently loaded in the bitline, the sensing amplifier enable signal SEN may be transited to a high level so as to activate the sensing amplifier in a state where the first and second top split wordlines SWL1 and SWL2 are turned ON. As a result, the bitline level is amplified.

Since the logic data "H" of the destroyed cell cannot be restored in a state where the first and second split wordlines SWL1 and SWL2 are high, the data can be restored during the period t3. Subsequently, during the period t3, the column selection signal CS may be activated at a high level, and the bitline of the cell may be connected with the data bus line. During the read mode, the bitline data may be transmitted to the data bus, and during the write mode, the data bus may be transmitted to the bitline.

In addition, during the period t3, the first and second top NMOS transistors NT1 and NT2 may be turned ON when the first and second top transmission signals TX1 and TX2 are maintained at a high level, the first and second bottom transmission signals BX1 and BX2 at a low level, the first split wordline control signal SWL1_CON at a low level, and the second split wordline control signal SWL2_CON at a high level. Accordingly, the first top split wordline SWL1 may be transited to a low level, and the second top split wordline SWL2 may be maintained at a high level.

During the period t4, the first and second top NMOS transistors NT1 and NT2 may be turned ON as the first and second top transmission signals TX1 and TX2 are maintained at a high level. In addition, the first and second split wordline control signals SWL1_CON and SWL2_CON of a high level may be transmitted to the first and second top split wordlines SWL1 and SWL2 through the first and second NMOS transistors NT1 and NT2. Accordingly, if data of the bitline has a logical "0" value, then the logical "0" value may be written in each ferroelectric capacitor of the top cell array. Meanwhile, when the bitline is a high level, no changes occur in data of the cell.

During the period t5, the first and second top NMOS transistors NT1 and NT2 may be turned ON as the first and second top transmission signals TX1 and TX2 are maintained at a high level. In addition, the first split wordline control signal SWL1_CON of high level and the second split wordline control signal SWL2_CON of low level may be transmitted to the first and second top split wordlines SWL1 and SWL2 through the first and second NMOS transistors NT1 and NT2. Accordingly, the first top split wordline SWL1 may be maintained at a high level, and the second top split wordline SWL2 may be transited to a low level, thereby the NMOS transistor of the cell is turned ON. Likewise, if the corresponding bitline is a high level, high level data may be transmitted to one electrode of the first ferroelectric capacitor FC1 so that a logical "1" value may be restored between the low level of the second top split wordline SWL2 and the high level of the bitline.

A period t6 denotes a precharge period for preparing a next cycle operation.

During the above operation, the first split wordline control signal may be alternatively transmitted to the first top split wordline and the first bottom split wordline by the first top transmission signal and the first bottom transmission signal that respectively control the first top NMOS transistor of the top split wordline driver and the first bottom NMOS transistor of the bottom split wordline driver. In addition, the second split wordline control signal may be alternatively transmitted to the second top split wordline and the second bottom split wordline by the second top transmission signal and the second bottom transmission signal that respectively control the second top NMOS transistor of the top split wordline driver and the second bottom NMOS transistor of the bottom split wordline driver.

Operation of the 1T1C chip will be described when the bottom cell array block only is activated.

The operation when the bottom cell array block only is activated is identical to the operation when the top cell array block only is activated except that, as shown in FIG. 10, the first and second top transmission signals TX1 and TX2 are maintained at a low level during the periods t0~t6, and the first and second bottom transmission signals BX1 and BX2 are maintained at a high level during the periods t1~t5.

Operation of a 2T2C structure based on the cell array according to the present invention will be described with reference to FIGS. 7 and 11.

Figure 11:
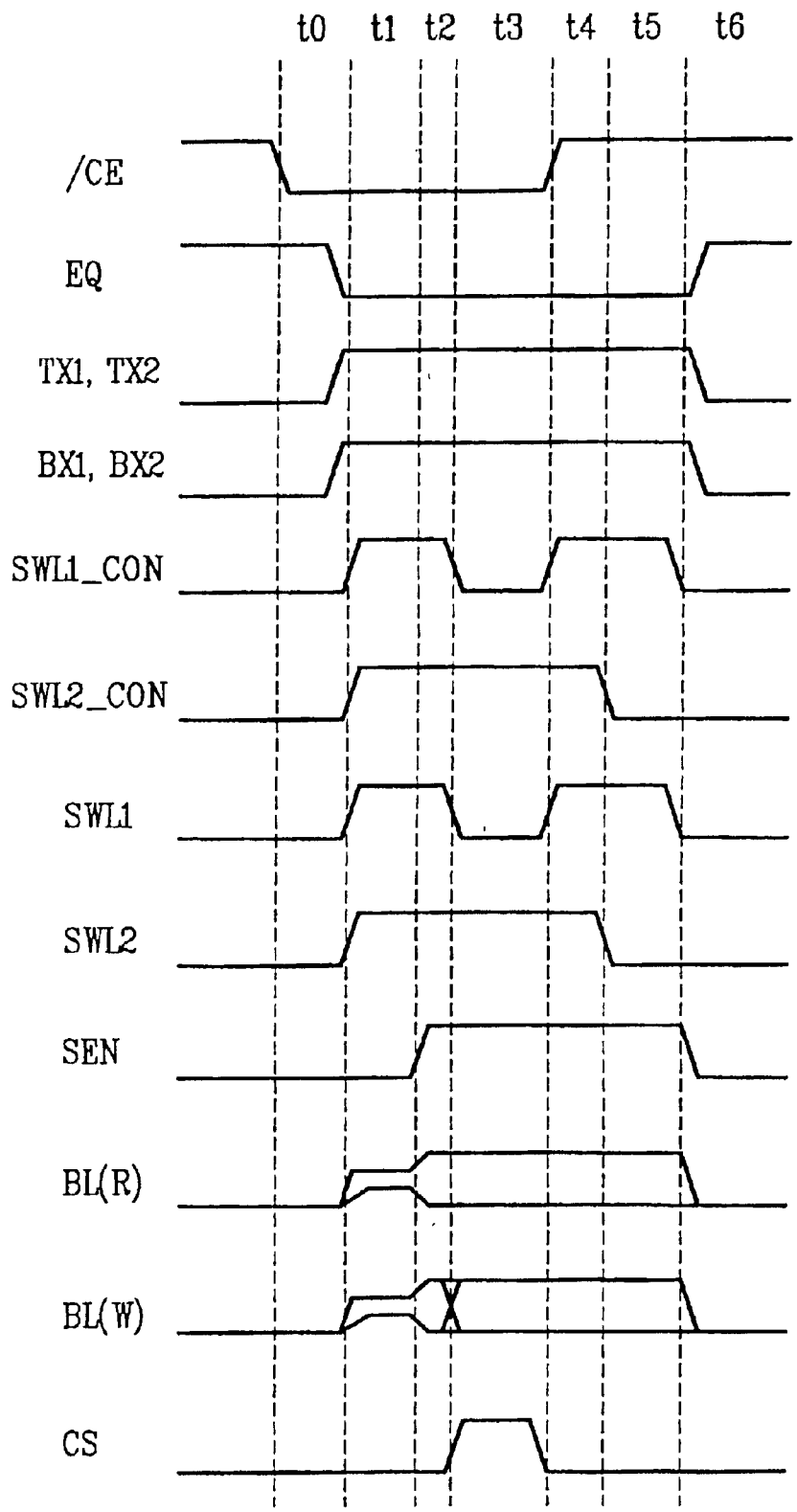
FIG. 11 is an operational timing chart of another exemplary method in the circuit according to the present invention.

In FIGS. 7 and 11, the first and second top transmission signals TX1 and TX2 and the first and second bottom transmission signals BX1 and BX2 may be simultaneously maintained at a high level, such that the first and second bottom split wordlines of the top and bottom cell arrays are simultaneously activated. Thus, corresponding cells of the top cell array and the bottom cell array may be simultaneously driven, and the operation of the 2T2C structure may be identical to the operation of the 1T1C structure.

During the operation of the 2T2C structure, the first split wordline control signal may be simultaneously transmitted to the first top split wordline and the first bottom split wordline by the first top transmission signal and the first bottom transmission signal that respectively control the first top NMOS transistor of the top split wordline driver and the first bottom NMOS transistor of the bottom split wordline driver. In addition, the second split wordline control signal may be simultaneously transmitted to the second top split wordline and the second bottom split wordline by the second top transmission signal and the second bottom transmission signal, which respectively control the second top NMOS transistor of the top split wordline driver and the second bottom NMOS transistor of the bottom split wordline driver.

The cell array of the nonvolatile ferroelectric memory device and the method for operating the nonvolatile ferroelectric memory device according to the present invention have the following advantages. The cell array may be arranged to drive the split wordline cell in a vertical direction, i.e., the bitline direction, and the top and bottom split wordline drivers may be arranged. Accordingly, an RC load of the first and second split wordline drivers in the top and bottom blocks may be dispersed, and no load difference occurs. Therefore, it is possible to improve operational speed and bitline sensing margin. Furthermore, it is possible to efficiently arrange layout of the split wordlines.

It will be apparent to those skilled in the art than various modifications and variations can be made in the nonvolatile ferroelectric memory device and method for operating a nonvolatile ferroelectric memory device of the present invention. Thus, it is intended that the present invention covers the modifications and variations of this invention provided they come within the scope of the appended claims and their equivalents.

What is claimed is:

1. A nonvolatile ferroelectric memory device, comprising:
    a top cell array block including a first plurality of unit cells, each unit cell having a pair of first and second top split wordlines connected with a gate of a switching transistor and one node of a ferroelectric capacitor, and each unit cell formed in a split structure with a corresponding unit cell along a bitline;
    a bottom cell array block provided with a second plurality of unit cells, each unit cell having a pair of first and second bottom split wordlines to correspond to the pair of first and second top split wordlines, the first and second bottom split wordlines being connected with a gate of a switching transistor and one node of a ferroelectric capacitor; a top split wordline driver controlling an output signal transmitted to the pair of first and second top split wordlines of the top cell array block;
    a bottom split wordline driver controlling an output signal transmitted to the pair of first and second bottom split wordlines of the bottom cell array block;
    a split wordline driver controller outputting first and second split wordline control signals transmitted to the first and second top split wordlines and the first and second bottom split wordlines, under control of the top and bottom split wordline drivers; and
    a sensing amplifier arranged for each bitline between the top cell array block and the bottom cell array block,
    wherein the top cell array block includes a first top cell array at a first side of the top split wordline driver and a second top cell array at a second side of the top split wordline driver opposite to the first side,
    wherein the gate of the switching transistor and the one node of the ferroelectric capacitor of each unit cell of the first top cell array block and the second top cell array block are connected with one split wordline of the pair of split wordlines.

2. The device according to claim 1, wherein the bottom cell array block includes a first bottom cell array at a first side of the bottom split wordline driver and a second bottom cell array at a second side of the bottom split wordline driver opposite to the first side.

3. The device according to claim 2, wherein the gate of the switching transistor and the one node of the ferroelectric capacitor of each unit cell of the first bottom cell array block and the second bottom cell array block are connected with one split wordline of the pair of the split wordlines.

4. A nonvolatile ferroelectric memory device, comprising:
    a first top cell array block provided with a first plurality of unit cells, each unit cell having a pair of first and second top split wordlines, wherein the first top split wordline is connected to a gate of a switching transistor included in each unit cell and the second top split wordline is connected to one node of a ferroelectric capacitor included in each unit cell;
    a second top cell array block provided with a second plurality of unit cells having one of a same structure and a symmetrical structure as the first top cell array block;
    a first bottom cell array block having a split structure with the first top cell array block along a bitline;
    a second bottom cell array block having a split structure with the second top cell array block along the bitline;
    a top split wordline driver controlling an output signal transmitted to the pair of first and second top split wordlines shared by the first and second top cell array blocks, wherein the top split wordline driver includes a top decoder outputting first and second top switching control signals, and first and second top switching devices controlling the first and second split wordline control signals output from the split wordline driver controller transmitted to the first and second top split wordlines;
    a bottom split wordline driver controlling an output signal transmitted to the pair of first and second bottom split wordlines shared by the first and second bottom cell array blocks, wherein the bottom split wordline driver includes a bottom decoder outputting first and second bottom switching control signals, and first and second bottom switching devices controlling the first and second split wordline control signals output from the split wordline driver controller transmitted to the first and second bottom split wordlines;
    a split wordline driver controller outputting first and second split wordline control signals transmitted to the pair of first and second top split wordlines and the pair of first and second bottom split wordlines, under control of the top and bottom split wordline drivers; and
    a sensing amplifier arranged for each bitline between the first top cell array block and the first bottom cell array block and between the second top cell array block and the second bottom cell array block.

5. The device according to claim 4, wherein the gate of the switching transistor of the second plurality of unit cells constituting the second bottom cell array block is connected with the second bottom split wordline and the one node of the ferroelectric capacitor is connected with the first bottom split wordline.

6. The device according to claim 4, wherein the gate of the switching transistor of the second plurality of unit cells constituting the second bottom cell array block is connected with the first bottom split wordline and the one node of the ferroelectric capacitor is connected with the second bottom split wordline.

7. The device according to claim 4, wherein the first and second top switching devices are NMOS transistors.

8. The device according to claim 4, wherein the first and second bottom switching devices are NMOS transistors.

9. A method for operating a nonvolatile ferroelectric memory device that includes a top cell array block having a first and a second top cell array blocks and a bottom cell array block having a first and a second bottom cell array blocks arranged in a split structure along a bitline, a pair of first and second top split wordlines shared by the first and second top cell array blocks and a pair of first and second bottom split wordlines shared by the first and second bottom cell array blocks respectively arranged in the top cell array block and the bottom cell array block, a top split wordline driver arranged between the first and second top cell array blocks and a bottom split wordline driver arranged between the first and second bottom cell array blocks, and a split wordline driver controller generating a first split wordline control signal transmitted to the first top split wordline and the first bottom split wordline, and a second split wordline control signal transmitted to the second top split wordline and the second bottom split wordline, comprising the steps of:
    outputting in the top split wordline driver first and second top switching control signals activated at a high level during one cycle, and at a same time outputting in the bottom split wordline driver first and second bottom switching control signals of a low level;

activating the first and second top split wordlines at a high level when the first and second split wordline control signals are output at a high level;

respectively transmitting a low level and a high level to the first and second top split wordlines when the first and second split wordline control signals are respectively output at a low level and a high level; and respectively transmitting a high level and a low level to the first and second top split wordlines when the first and second split wordline control signals are output at a high level and a low level.

10. The method according to claim 9, wherein the first and second top switching control signals are output from a top decoder of the top split wordline driver, and the first and second bottom switching control signals are output from a bottom decoder of the bottom split wordline driver.

11. The method according to claim 9, wherein the first split wordline control signal is alternatively transmitted to the first top split wordline and the first bottom split wordline by the first top switching control signal and the first bottom switching control signal that respectively control a first top switching transistor of the top split wordline driver and a first bottom switching transistor of the bottom split wordline driver.

12. The method according to claim 9, wherein the second split wordline control signal is alternatively transmitted to the second top split wordline and the second bottom split wordline by the second top switching control signal and the second bottom switching control signal which respectively control a second top switching transistor of the top split wordline driver and a second bottom switching transistor of the bottom split wordline driver.

13. A method for operating a nonvolatile ferroelectric memory device that includes a top cell array block having a first and a second top cell array blocks and a bottom cell array block having a first and a second bottom cell array blocks arranged in a split structure along a bitline, a pair of first and second top split wordlines shared by the first and second top cell array blocks and a pair of first and second bottom split wordlines shared by the first and second bottom cell array blocks respectively arranged in the top cell array block and the bottom cell array block, a top split wordline driver arranged between the first and second top cell array blocks and a bottom split wordline driver arranged between the first and second bottom cell array blocks, and a split wordline driver controller generating a first split wordline control signal transmitted to the first top split wordline and the first bottom split wordline, and a second split wordline control signal transmitted to the second top split wordline and the second bottom split wordline, comprising the steps of:

outputting in the top split wordline driver first and second top switching control signals of a low level during one cycle, and at a same time outputting in the bottom split wordline driver first and second bottom switching control signals of a high level;

activating the first and second top split wordlines at high level when the firsthand second split wordline control signals are output at a high level;

respectively transmitting a low level and a high level to the first and second bottom split wordlines when the first and second split wordline control signals are respectively output at a low level and a high level; and respectively transmitting a high level and a low level to the first and second bottom split wordlines when the first and second split wordline control signals are output at a high level and a low level.

14. The method according to claim 13, wherein the first and second top switching control signals are output from a top decoder of the top split wordline driver, and the first and second bottom switching control signals are output from a bottom decoder of the bottom split wordline driver.

15. The method according to claim 13, wherein the first split wordline control signal is alternatively transmitted to the first top split wordline and the first bottom split wordline by the first top switching control signal and the first bottom switching control signal that respectively control a first top switching transistor of the top split wordline driver and a first bottom switching transistor of the bottom split wordline driver.

16. The method according to claim 13, wherein the second split wordline control signal is alternatively transmitted to the second top split wordline and the second bottom split wordline by the second top switching control signal and the second bottom switching control signal that respectively control a second top switching transistor of the top split wordline driver and a second bottom switching transistor of the bottom split wordline driver.

17. A method for operating a nonvolatile ferroelectric memory device that includes a top cell array block having a first and a second top cell array blocks and a bottom cell array block having a first and a second bottom cell array blocks arranged in a split structure along a bitline, a pair of first and second top split wordlines shared by the first and second top cell array blocks and a pair of first and second bottom split wordlines shared by the first and second bottom cell array blocks respectively arranged in the top cell array block and the bottom cell array block, a top split wordline driver arranged between the first and second top cell array blocks and a bottom split wordline driver arranged between the first and second too cell array blocks, and a split wordline driver controller generating a first split wordline control signal transmitted to the first top split wordline and the first bottom split wordline, and a second split wordline control signal transmitted to the second top split wordline and the second bottom split wordline, comprising the steps of:

outputting in the top and bottom split wordline drivers first and second top switching control signals and first and second bottom switching control signals at a high level during one cycle;

activating the first and second top split wordlines and the first and second bottom split wordlines at a high level when the first and second split wordline control signals are output at a high level;

respectively transmitting a low level and a high level to the first and second top split wordlines when the first and second split wordline control signals are respectively output at a low level and a high level, and at a same time respectively transmitting a low level and a high level to the first and second bottom split wordlines; and respectively transmitting a high level and a low level to the first and second top split wordlines when the first and second split wordline control signals are respectively output at a high level and a low level, and at a same time respectively transmitting a high level and a low level to the first and second bottom split wordlines.

18. The method according to claim 17, wherein the first and second top switching control signals are output from a top decoder of the top split wordline driver, and the first and second bottom switching control signals are output from a bottom decoder of the bottom split wordline driver.

19. The method according to claim 17, wherein the first split wordline control signal is simultaneously transmitted to the first top split wordline and the first bottom split wordline by the first top switching control signal and the first bottom switching control signal which respectively control the first top switching transistor of the top split wordline driver and the first bottom switching transistor of the bottom split wordline driver.

20. The method according to claim 17, wherein the second split wordline control signal is simultaneously transmitted to the second top split wordline and the second bottom split wordline by the second top switching control signal and the second bottom switching control signal which respectively control the second top switching transistor of the top split wordline driver and the second bottom switching transistor of the bottom split word line driver.

* * * * *